(12) United States Patent
Ang et al.

(10) Patent No.: US 6,841,441 B2
(45) Date of Patent: Jan. 11, 2005

(54) METHOD TO PRODUCE DUAL GATES (ONE METAL AND ONE POLY OR METAL SILICIDE) FOR CMOS DEVICES USING SPUTTERED METAL DEPOSITION, METALLIC ION IMPLANTATION, OR SILICON IMPLANTATION, AND LASER ANNEALING

(75) Inventors: Chew Hoe Ang, Singapore (SG);
Eng-Hua Lim, Singapore (SG);
Randall Cher Liang Cha, Singapore (SG); Jia Zhen Zheng, Singapore (SG);
Elgin Quek, Singapore (SG);
Mei-Sheng Zhou, Singapore (SG);
Daniel Yen, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/338,156

(22) Filed: Jan. 8, 2003

(65) Prior Publication Data

US 2004/0132271 A1 Jul. 8, 2004

(51) Int. Cl.[7] .......................................... H01L 21/8238
(52) U.S. Cl. ...................... 438/232; 438/275; 438/532; 438/592; 438/659
(58) Field of Search ................................ 438/232, 275, 438/532, 592, 655, 659, 660

(56) References Cited

U.S. PATENT DOCUMENTS

| | | | |
|---|---|---|---|
| 5,122,479 A | | 6/1992 | Audet et al. ................. 437/200 |
| 5,236,872 A | | 8/1993 | van Ommen et al. ........ 437/200 |
| 6,027,961 A | * | 2/2000 | Maiti et al. .................. 438/592 |
| 6,043,157 A | | 3/2000 | Gardner et al. ............. 438/692 |
| 6,087,236 A | | 7/2000 | Chau et al. .................. 438/301 |
| 6,177,335 B1 | * | 1/2001 | Park et al. ................... 438/592 |
| 6,294,434 B1 | * | 9/2001 | Tseng .......................... 438/533 |
| 6,589,836 B1 | * | 7/2003 | Wang et al. ................. 438/592 |

* cited by examiner

*Primary Examiner*—Chandra Chaudhari
(74) *Attorney, Agent, or Firm*—George O Saile; Rosemary L. S. Pike; Stephen G. Shanton

(57) ABSTRACT

A method of fabricating first and second gates comprising the following steps. A substrate having a gate dielectric layer formed thereover is provided. The substrate having a first gate region and a second gate region. A thin first gate layer is formed over the gate dielectric layer. The thin first gate layer within the second gate region is masked to expose a portion of the thin first gate layer within the first gate region. The exposed portion of the thin first gate layer is converted to a thin third gate layer portion. A second gate layer is formed over the thin first and third gate layer portions. The second gate layer and the first and third gate layer portions are patterned to form a first gate within first gate region and a second gate within second gate region.

37 Claims, 5 Drawing Sheets ary of the First Embodiment
METHOD TO PRODUCE DUAL GATES (ONE METAL AND ONE POLY OR METAL SILICIDE) FOR CMOS DEVICES USING SPUTTERED METAL DEPOSITION, METALLIC ION IMPLANTATION, OR SILICON IMPLANTATION, AND LASER ANNEALING

BACKGROUND OF THE INVENTION

The evolution of dual gate technology in integrated circuit (IC) devices has evolved from having doped polycrystalline gates resting on different gate oxide thicknesses to introduction of different metal gates lying over high k dielectrics. Owing to an alteration in work function from the changing oxide thickness and different metals, devices on the same chip can operate by different voltages. However, the polycrystalline gates can suffer from depletion effects as oxides grow thinner, especially for the case of implanted n-doped gates. For the thinner oxides, reliability and integrity also pose serious concerns.

Some means to resolve these problems will be to use metal gates, in-situ p- or n-doped poly gates (minimum poly depletion effects) and high-k dielectrics. Preferably, the initial intention of having different work function can be accomplished by varying gate electrodes rather than changing oxide thickness.

U.S. Pat. No. 5,236,872 to van Ommen et al. describes a process of forming a silicide layer in a poly layer by a metal ion implantation (I/I) and anneal.

U.S. Pat. No. 6,043,157 to Gardner et al. describes a process of forming a semiconductor device having dual gate electrode material.

U.S. Pat. No. 5,122,479 to Audet et al. describes a method of manufacturing a semiconductor device comprising a silicide layer.

U.S. Pat. No. 6,087,236 to Chau et al. describes a method of making an integrated circuit with multiple gate dielectric structures.

SUMMARY OF THE INVENTION

Accordingly, it is an object of the present invention to provide a method of forming dual gates for CMOS devices using implantation and annealing processes.

Another object of the present invention is to provide a method of forming dual gates for CMOS devices using sputtered metal deposition of metallic ion implantation and annealing.

A further object of the present invention is to provide a method of forming dual gates for CMOS devices using Si implantation and annealing.

Other objects will appear hereinafter.

It has now been discovered that the above and other objects of the present invention may be accomplished in the following manner. Specifically, a substrate having a gate dielectric layer formed thereover is provided. The substrate having a first gate region and a second gate region. A thin first gate layer is formed over the gate dielectric layer. The thin first gate layer within the second gate region is masked to expose a portion of the thin first gate layer within the first gate region. The exposed portion of the thin first gate layer is converted to a thin third gate layer portion. A second gate layer is formed over the thin first and third gate layer portions. The second gate layer and the first and third gate layer portions are patterned to form a first gate within first gate region and a second gate within second gate region.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Unless otherwise specified, all structures, layers, etc. may be formed or accomplished by conventional methods known in the prior art.

First Embodiment
Summary of the First Embodiment

The first embodiment extends on the replacement gate method to form the proposed dual gates. After the nitride gate removal, a high-k dielectric (gate dielectric) is deposited. Instead of a whole doped poly deposition as done in a conventional replacement gate process, a thinner layer of poly is deposited over the gate dielectric. The poly is then partially masked, preferably using either the L59, L65 or L70 mask, and the exposed poly is subjected to either a metallic ion implantation or a sputtered metal deposition. It is noted that for a metallic ion implantation, a photoresist mask may be used and for a sputtered metal deposition a nitride/oxide mask, for example, is used. Upon removal of the mask, the entire poly surface is heated, preferably by a laser treatment. The portion of the poly 'contaminated' with metal will be transformed to silicide. Another layer of either poly or metal is formed over the poly/poly-silicide layer followed by planarization, preferably by CMP, to eliminate shorts between the patterned poly gate and poly-silicide gate. The poly and poly-silicide gates have different work functions.

Initial Structure

Figure 1:
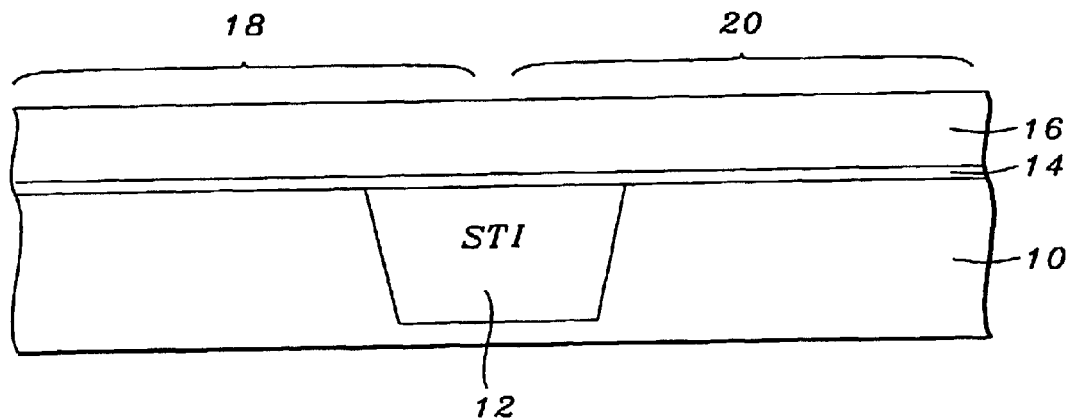
FIGS. 1 to 5 schematically illustrate in cross-sectional representation a first embodiment of the present invention.

FIG. 1 illustrates a cross-sectional view of a substrate 10, preferably a semiconductor substrate comprised of silicon (Si) or germanium (Ge) and is more preferably comprised of silicon. Substrate 10 includes poly/silicide gate region 18 and poly gate region 20.

Shallow trench isolation (STI) 12 may be formed within substrate 10 and serves to isolate the dual gates 32, 34 to be formed on either side of STI 12. Other isolation techniques or structures may be used.

Gate dielectric layer 14 is formed over substrate 10 to a thickness of preferably from about 10 to 100 Å and more preferably from about 10 to 20 Å. Gate dielectric layer 14 is preferably comprised of grown oxide or a high-k dielectric material, i.e. having a dielectric constant of greater than about 3.0, and is more preferably comprised of grown oxide.

Thin first gate layer 16 is then formed over gate dielectric layer 14 to a thickness of preferably from about 100 to 800 Å and more preferably from about 200 to 500 Å. First gate layer 16 is preferably comprised of polysilicon (poly), amorphous silicon or alpha (α)-silicon and is more preferably comprised of poly.

Ion Implantation or Metal Deposition

Figure 2:
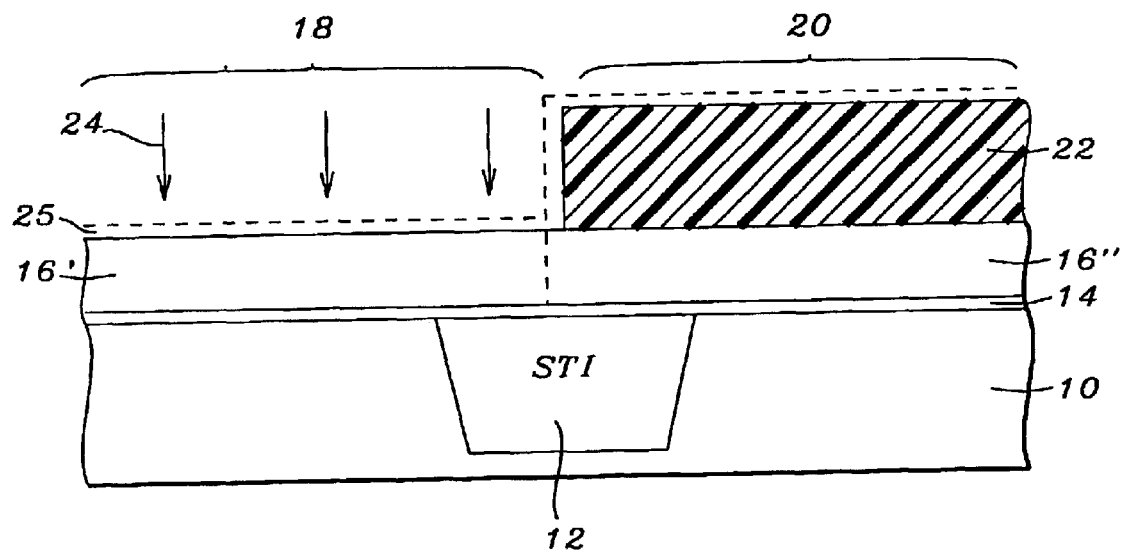

As shown in FIG. 2, masking layer 22 is formed over first poly layer 16 within poly gate region 20 leaving first poly layer 16 within poly/silicide gate region 18 exposed. For example the L59, L65 or L70 mask may be used with masking layer 22 preferably formed of photoresist.

I. A metallic ion implantation 24 is then conducted into the exposed first poly layer 16 within poly/silicide gate region 18 to a preferably concentration of from about 1E16 to 1E20 atoms/cm$^3$ and more preferably from about 1E7 to 1E19 atoms/cm$^3$. This forms first poly/metal layer portion 16'. Instead of metallic ions, germanium may be implanted 24 into exposed first poly layer 16 within poly/silicide gate region 18 to a preferably concentration of from about 1E16 to 1E20 atoms/cm$^3$ and more preferably from about 1E17 to 1E19 atoms/cm$^3$. This forms first poly/germanium layer portion 16'.

II. Alternatively, a metal deposition 24 may be conducted, preferably by a sputtered metal deposition, to form a thin layer of metal 25 shown in dashed line. If a sputtered metal deposition 24 is chosen, then mask 22 is comprised of a nitride/oxide layer. In this option layers 16', 16" are each still comprised of poly.

Preferably, a metallic ion implantation or sputtered metal deposition is conducted. Germanium may also be implanted as at 24.

Formation of Metal Silicide Portion 26

Figure 3:
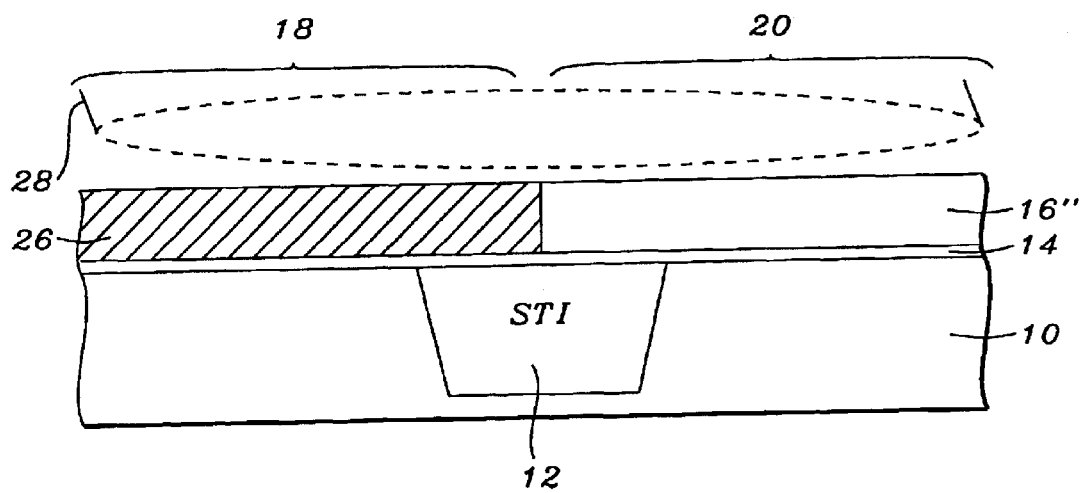
Figure 4:
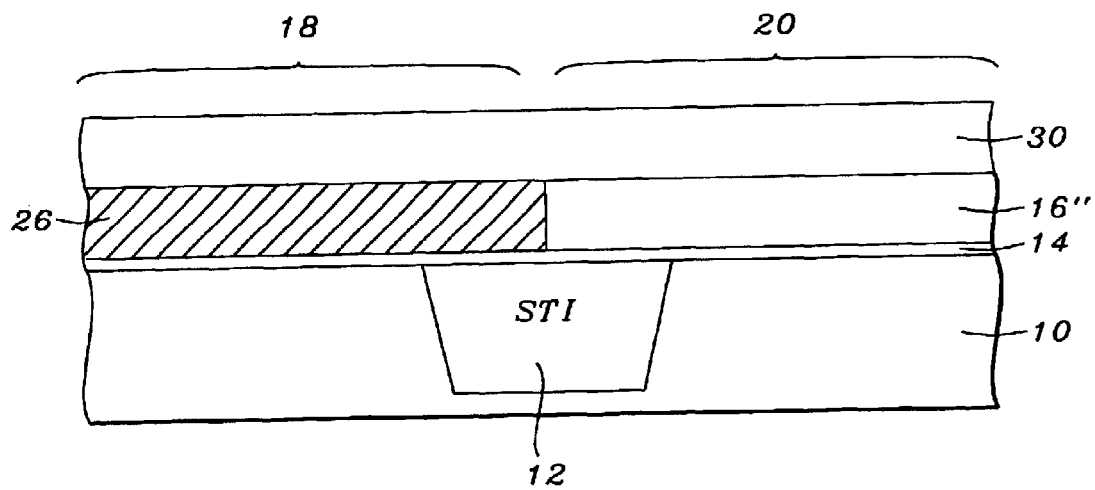

As shown in FIG. 3, mask 22 is removed, preferably by a photoresist stripping process, and the structure is cleaned, preferably by a CRS cleaning process. Any metal 25 deposited over mask 22 is removed by an etch-back or a wet clean process.

I. The structure is then annealed, preferably by a laser anneal 28 (die by die, scanning or rastering) to heat at least the first poly/metal layer portion 16' to form metal suicide layer portion 26 by the reaction of the poly and metal within first poly/metal layer portion 16'.

II. If a thin metal layer 25 was formed over poly layer 16' instead of using an ion implantation 24, then when the structure is annealed, preferably by a laser anneal 28 (die by die, scanning or rastering), at least the first poly layer 16' and thin metal layer 25 are heated to form metal silicide layer portion 26 by the reaction of the poly within first poly layer 16' and the overlying metal layer 25.

Formation of Second Gate Layer 30

Figure 5:
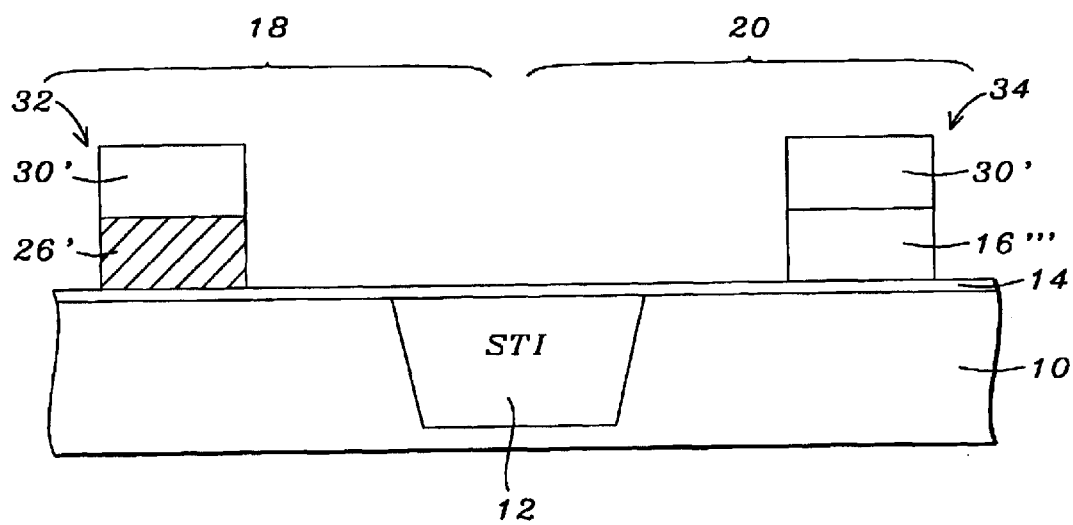

As shown in FIG. 5, second gate layer 30 is formed over first gate layer portion 16" (metal silicide layer portion 26 and first poly layer portion 16") to a thickness of from about 1000 to 2000 Å and more preferably from about 1000 to 1500 Å. Second gate layer 30 is preferably either: a poly-silicon (poly) layer; or a metal layer that is comprised of tungsten or tungsten silicate and more preferably comprised of poly.

Patterning of First and Second Gate Layers 26, 16"; 30 to Form Poly/Silicide Gate 32 and Poly Gate 34

Second gate layer 30 and the first gate layer (comprised of metal silicide layer portion 26 and first gate layer portion 16") are then patterned to form poly/silicide gate 32 within poly/silicide gate region 18 and poly gate 34 within poly gate region 20. Second gate layer 30 and the first gate layer may be patterned through the use of an L60 gate etch for example.

Second Embodiment

Summary of the Second Embodiment

The second embodiment also extends on the replacement gate method to form the proposed dual gates. After the nitride gate removal, a high-k dielectric (gate dielectric) is deposited. Instead of a whole metal deposition as done in a conventional replacement gate process, a thinner layer of metal is deposited over the gate dielectric. The metal is then partially masked, preferably using either the L65 or L70 mask, and the exposed metal is subjected to a silicon (Si) implantation. Upon removal of the mask, the entire metal surface is heated, preferably by a laser treatment. The portion of the metal 'contaminated' with silicon will be transformed to silicide. Another layer of the same metal may formed over the metal/metal-silicide layer followed by planarization, preferably by CMP, to eliminate shorts between the patterned metal gate and metal-silicide gate. The metal and metal-silcide gates have different work functions.

Initial Structure

Figure 6:
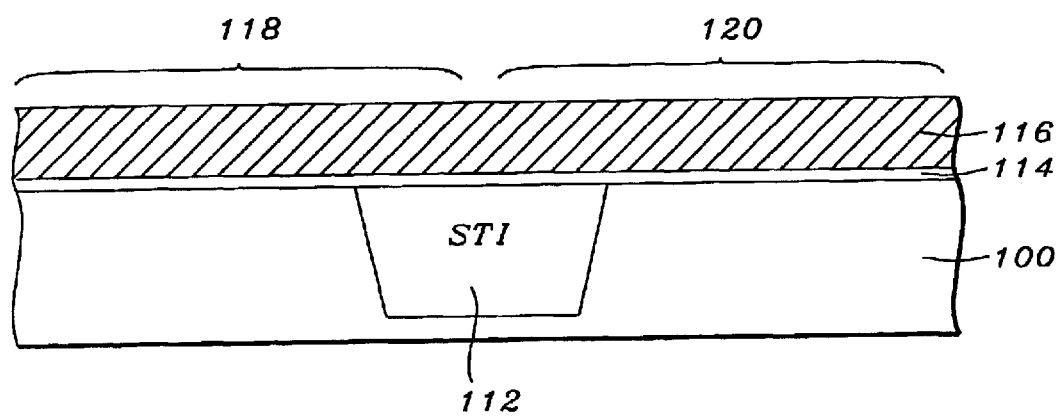
FIGS. 6 to 10 schematically illustrate in cross-sectional representation a second embodiment of the present invention.

FIG. 6 illustrates a cross-sectional view of a substrate 110, preferably a semiconductor substrate comprised of silicon (Si) or germanium (Ge) and is more preferably comprised of silicon. Substrate 110 includes metal/silicide gate region 118 and metal gate region 120.

Shallow trench isolation (STI) 112 may be formed within substrate 110 and serves to isolate the dual gates 132, 134 to be formed on either side of STI 112. Other isolation techniques or structures may be used.

Gate dielectric layer 114 is formed over substrate 110 to a thickness of preferably from about 10 to 100 Å and more preferably from about 10 to 20 Å. Gate dielectric layer 114 is preferably comprised of grown oxide or a high-k dielectric material, i.e. having a dielectric constant of greater than about 3.0, and is more preferably comprised of grown oxide.

Thin first gate layer 116 is then formed over gate dielectric layer 114 to a thickness of preferably from about 100 to 800 Å and more preferably from about 200 to 500 Å. First gate layer 116 is preferably comprised of a metal such as tungsten (W), tantalum (Ta), molybdenum (Mo) or germanium (Ge) and is more preferably comprised of a metal such as tungsten (W).

Silicon Implantation

Figure 7:
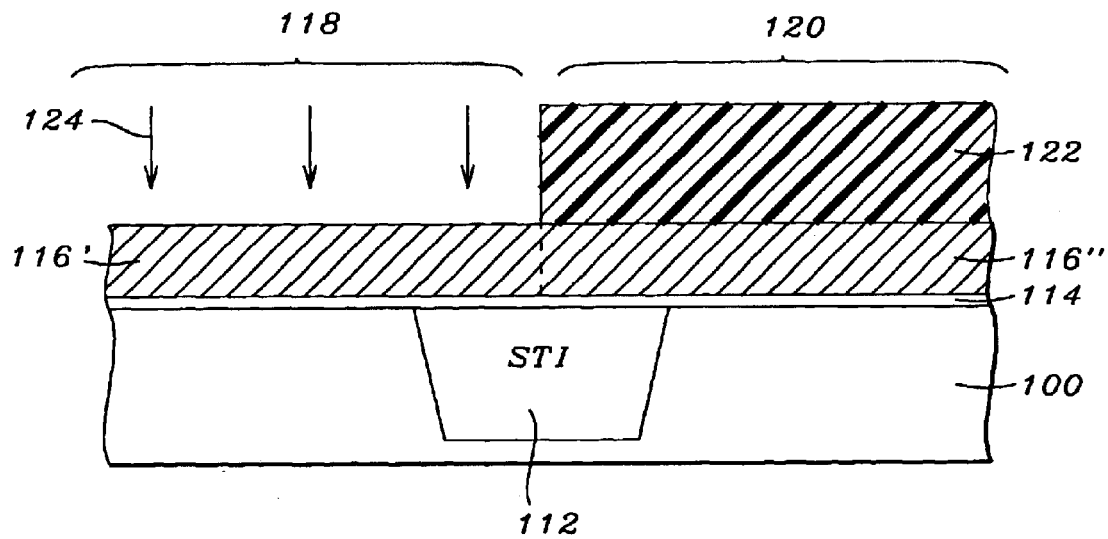

As shown in FIG. 7, masking layer 122 is formed over first metal layer 116 within metal gate region 120 leaving first metal layer 116 within metal/silicide gate region 118 exposed. For example the L59, L65 or L70 mask may be used with masking layer 122 preferably formed of photoresist.

A silicon implantation 124 is then conducted into the exposed first metal layer 16 within metal/silicide gate region 118 to a preferably concentration of from about 1E16 to 1E20 Si atoms/cm$^3$ and more preferably from about 1E17 to 1E19 Si atoms/cm$^3$. This forms first metal/Si layer portion 116'.

If layer 116 is comprised of germanium, a silicon implantation 124 is conducted into the exposed first germanium layer 116 within metal/silicide gate region 118 to a preferably concentration of from about 1E16 to 1E20 Si atoms/cm$^3$ and more preferably from about 1E17 to 1E9 Si atoms/cm$^3$. This forms first germanium/Si layer portion 116'.

Formation of Silicide Portion 126

Figure 8:
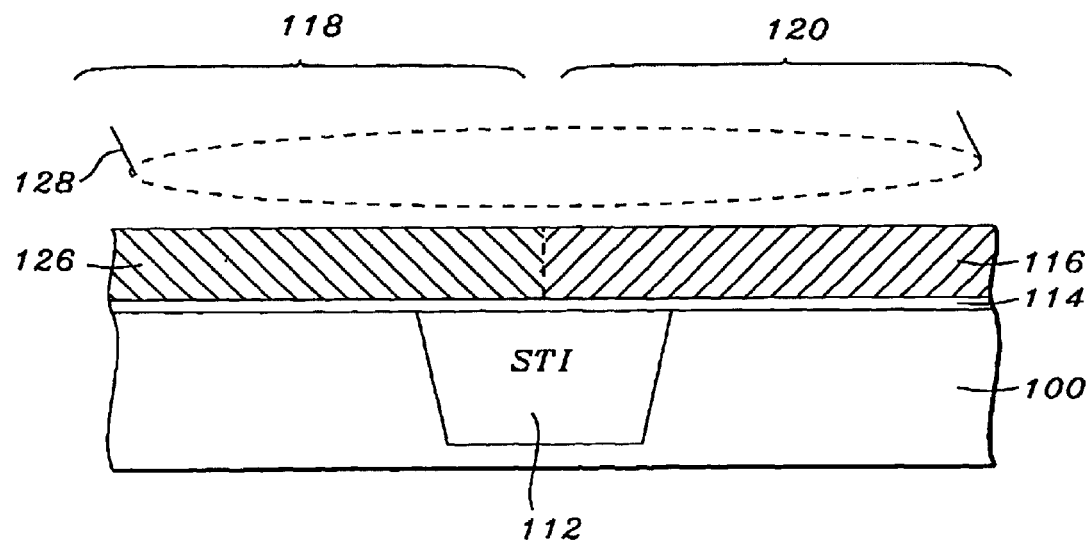

As shown in FIG. 8, mask 122 is removed, preferably by a photoresist stripping process, and the structure is cleaned, preferably by a CRS cleaning process.

The structure is then annealed, preferably by a laser anneal 128 (die by die, scanning or rastering) to heat at least the first metal/Si layer portion 116' to form metal silicide layer portion 126 by the reaction of the metal and silicon within first metal/Si layer portion 116'.

If portion 116' is comprised of germanium/Si, then the annealing forms germanium silicide layer portion 126 by the reaction of the germanium and silicon within first germanium/Si layer portion 116'.

Formation of Second Gate Layer 130

Figure 9:
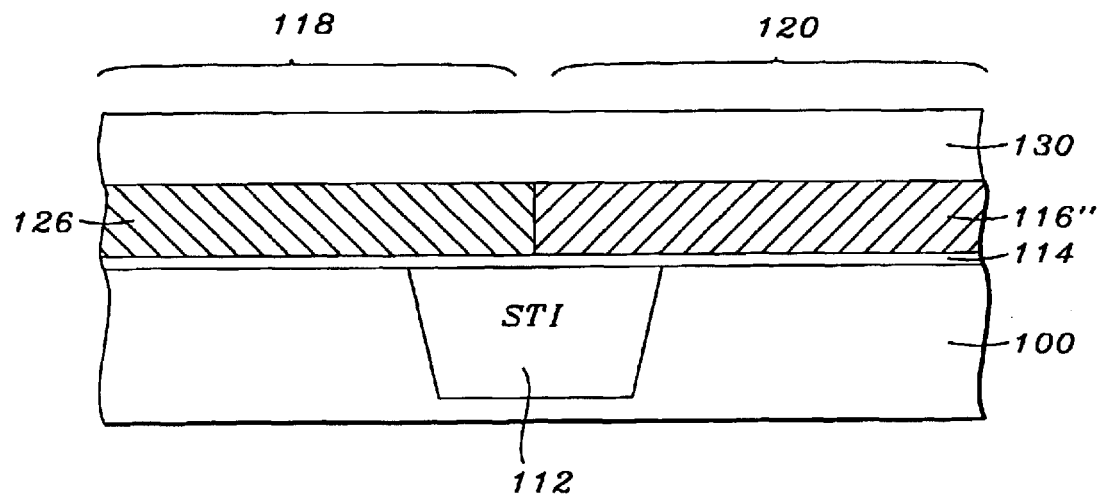
Figure 10:
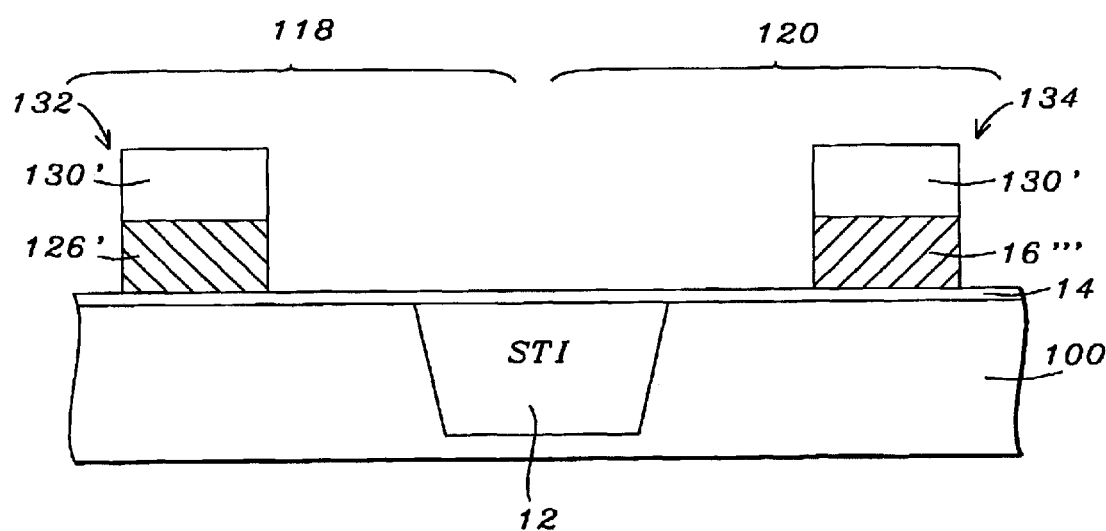

As shown in FIG. 9, second gate layer 130 is formed over first gate layer portion 116 (metal suicide layer portion 126 and first metal layer portion 116") to a thickness of from about 1000 to 2000 Å and more preferably from about 1000 to 1500 Å. Second gate layer 130 is preferably either: a metal layer that is comprised of tungsten (W), tantalum (Ta) or molybdenum (Mo); or a polysilicon (poly) layer. Second gate layer 130 is more preferably comprised of a metal.

Patterning of First and Second Gate Layers 126, 116"; 130 to Form Metal/Silicide Gate 132 and Metal Gate 134

Second gate layer 130 and the first gate layer (comprised of metal silicide layer portion 126 and first gate metal layer portion 116") are then patterned to form metal/silicide gate 132 within metal/silicide gate region 118 and metal gate 134 within metal gate region 120. Second gate layer 130 and the first gate layer may be patterned through the use of an L60 gate etch for example.

Advantages of the Invention

The advantages of the present invention include:
1) dual work function to optimize threshold voltage for a NMOSFET and PMOSFET, respectively;
2) no poly depletion for NMOSFET and PMOSFET; and
3) no boron penetration issue is PMOSFET.

While particular embodiments of the present invention have been illustrated and described, it is not intended to limit the invention, except as defined by the following claims.

We claim:

1. A method of fabricating first and second gates, comprising the steps of:
   providing a substrate having a gate dielectric layer formed thereover; the substrate having a first gate region and a second gate region;
   forming a thin first gate layer over the gate dielectric layer;
   masking the thin first gate layer within the second gate region to expose a portion of the thin first gate layer within the first gate region;
   converting the exposed portion of the thin first gate layer to a thin third gate layer portion;
   forming a second gate layer over the thin first and third gate layer portions; and
   patterning the second gate layer and the first and third gate layer portions to form a first gate within first gate region and a second gate within second gate region.

2. The method of claim 1, wherein the substrate is comprised of silicon or germanium; the gate dielectric layer is comprised of grown oxide or a dielectric material having a dielectric constant of greater than about 3.0; the thin first gate layer is comprised of poly or a amorphous silicon; the second gate layer is comprised of poly or a metal.

3. The method of claim 1, wherein the substrate is comprised of silicon; the gate dielectric layer is comprised of grown oxide; the thin first gate layer is comprised of poly or alpha-silicon; and the second gate layer is comprised of poly or alpha-silicon.

4. The method of claim 1, wherein the gate dielectric layer is from about 10 to 100 Å thick; the thin first gate layer is from about 100 to 800 Å thick; and the second gate layer is from about 1000 to 1500 Å thick.

5. The method of claim 1, wherein the gate dielectric layer is from about 10 to 20 Å thick; the thin first gate layer is from about 200 to 500 Å thick; and the second gate layer is from about 1000 to 1500 Å thick.

6. The method of claim 1, including the step of forming an isolation structure within the substrate, dividing the first and second gate regions.

7. The method of claim 1, including the step of forming an STI within the substrate, dividing the first and second gate regions.

8. The method of claim 1, wherein the thin third gate layer portion is formed of metal silicide or germanium silicide.

9. The method of claim 1, wherein the first gate is a poly/metal silicide stack; a poly/germanium silicide stack; a metal/metal silicide stack; or a metal/germanium silicide stack.

10. The method of claim 1, wherein the conversion of the exposed portion of the thin first gate layer to the thin third gate layer portion is accomplished by the steps selected from:
    implanting metallic ions into the exposed portion of the thin first gate layer to form a thin first gate material/metal layer portion then annealing to form the thin third gate layer portion;
    depositing a thin layer of metal over at least the exposed portion of the thin first gate layer then annealing to form the thin third gate layer portion;
    implanting germanium into the exposed portion of the thin first gate layer to form a thin first gate material/germanium layer portion then annealing to form the thin third gate layer portion; or
    implanting silicon into the exposed portion of the thin first gate layer to form a thin first gate material/silicon layer portion then annealing to form the thin third gate layer portion.

11. The method of claim 1, wherein the thin first gate layer is comprised of poly and the conversion of the exposed portion of the thin first gate poly layer to the thin third gate layer portion is accomplished by:
    implanting metallic ions into the exposed portion of the thin first gate poly layer to form a thin first poly/metal layer portion then annealing to form the thin third gate layer portion that is comprised of metal silicide.

12. A method of fabricating first and second gates, comprising the steps of:
    providing a substrate having a gate dielectric layer formed thereover; the substrate having a first gate region and a second gate region;
    forming a thin first gate poly layer over the gate dielectric layer; masking the thin first gate poly layer within the second gate region to expose first gate poly layer over the gate dielectric layer; a portion of the thin first gate layer within the first gate region;
    converting the exposed portion of the thin first gate poly layer to a thin third gate layer portion;
    forming a second gate layer over the thin first and third gate layer portions; the second gate layer comprised of poly or a metal;
    patterning the second gate layer and the first and third gate layer portions to form a first gate within first gate region and a second gate within second gate region.

13. The method of claim 12, wherein the substrate is comprised of silicon or germanium; the gate dielectric layer is comprised of grown oxide or a dielectric material having a dielectric constant of greater than about 3.0; and the second gate layer is comprised of poly, tungsten or tungsten silicate.

14. The method of claim 12, wherein the substrate is comprised of silicon; the gate dielectric layer is comprised of grown oxide; and the second gate layer is comprised of poly.

15. The method of claim 12, wherein the gate dielectric layer is from about 10 to 100 Å thick; the thin first gate poly layer is from about 100 to 800 Å thick; and the second gate layer is from about 1000 to 2000 Å thick.

16. The method of claim 12, wherein the gate dielectric layer is from about 10 to 20 Å thick; the thin first gate layer is from about 200 to 500 Å thick; and the second gate layer is from about 1000 to 1500 Å thick.

17. The method of claim 12, including the step of forming an isolation structure within the substrate, dividing the first and second gate regions.

18. The method of claim 12, including the step of forming an STI within the substrate, dividing the first and second gate regions.

19. The method of claim 12, wherein the thin third gate layer portion is formed of metal silicide or germanium silicide.

20. The method of claim 12, wherein the first gate is a poly/metal silicide stack; a poly/germanium silicide stack; a metal/metal silicide stack; or a metal/germanium silicide stack.

21. The method of claim 12, wherein the conversion of the exposed portion of the thin first gate layer to the thin third gate poly layer portion is accomplished by the steps selected from:
   implanting metallic ions into the exposed portion of the thin first gate poly layer to form a thin first gate poly/metal layer portion then annealing to form the thin third gate layer portion that is comprised of metal silicide;
   depositing a thin layer of metal over at least the exposed portion of the thin first gate poly layer then annealing to form the thin third gate layer portion that is
   implanting germanium into the exposed portion of the thin first gate poly layer to form a thin first gate poly/germanium layer portion then annealing to form the thin third gate layer portion that is comprised of germanium silicide.

22. A method of fabricating first and second gates, comprising the steps of:
   providing a substrate having a gate dielectric layer formed thereover; the substrate having a first gate region and a second gate region;
   forming a thin first gate layer over the gate dielectric layer; the thin first gate layer being comprised of a metal or germanium;
   masking the thin first gate layer within the second gate region to expose a portion of the thin first gate layer within the first gate region;
   converting the exposed portion of the thin first gate layer to a thin third gate layer portion;
   forming a second gate layer over the thin first and third gate layer portions; and
   patterning the second gate layer and the first and third gate layer portions to form a first gate within first gate region and a second gate within second gate region.

23. The method of claim 22, wherein the substrate is silicon or germanium; the gate dielectric layer is grown oxide or a dielectric material having a dielectric constant of greater than about 3.0; the thin first gate layer is germanium, tungsten, tantalum or molybdenum; the second gate layer is comprised of poly, tungsten, tantalum or molybdenum.

24. The method of claim 22, wherein the substrate is comprised of silicon; the gate dielectric layer is comprised of grown oxide; the thin first gate layer is comprised of tungsten; and the second gate layer is comprised of a metal.

25. The method of claim 22, wherein the gate dielectric layer is from about 10 to 100 Å thick; the thin first gate layer is from about 100 to 800 Å thick; and the second gate layer is from about 1000 to 2000 Å thick.

26. The method of claim 22, wherein the gate dielectric layer is from about 10 to 20 Å thick; the thin first gate layer is from about 200 to 500 Å thick; and the second gate layer is from about 1000 to 1500 Å thick.

27. The method of claim 22, including the step of forming an isolation structure within the substrate, dividing the first and second gate regions.

28. The method of claim 22, including the step of forming an STI within the substrate, dividing the first and second gate regions.

29. The method of claim 22, wherein the thin third gate layer portion is formed of metal silicide or germanium silicide.

30. The method of claim 22, wherein the first gate is a metal/metal silicide stack; a metal/germanium silicide stack; a poly/metal silicide stack; or a poly/germanium silicide stack.

31. The method of claim 1, wherein the thin first gate layer is comprised of poly and the conversion of the exposed portion of the thin first gate poly layer to the thin third gate layer portion is accomplished by:
   implanting germanium into the exposed portion of the thin first gate poly layer to form a thin first poly/germanium layer portion then annealing to form the thin third gate layer portion that is comprised of germanium silicide.

32. The method of claim 1, wherein the thin first gate layer is comprised of poly and the conversion of the exposed portion of the thin first gate poly layer to the thin third gate layer portion is accomplished by:
   depositing a thin metal layer over at least the exposed portion of the thin first gate poly layer then annealing to form the thin third gate layer portion that is comprised of metal silicide.

33. The method of claim 1, wherein the thin first gate layer is comprised of metal and the conversion of the exposed portion of the thin first gate metal layer to the thin third gate layer portion is accomplished by:
   implanting silicon into the exposed portion of the thin first gate metal layer to form a thin first metal/silicon layer portion then annealing to form the thin third gate layer portion that is comprised of metal silicide.

34. The method of claim 1, wherein the thin first gate layer is comprised of germanium and the conversion of the exposed portion of the thin first gate germanium layer to the thin third gate layer portion is accomplished by:
   implanting silicon into the exposed portion of the thin first gate germanium layer to form a thin first germanium/silicon layer portion then annealing to form the thin third gate layer portion that is comprised of germanium silicide.

35. The method of claim 22, wherein the conversion of the exposed portion of the thin first gate layer to the thin third gate layer portion is accomplished by the step of implanting silicon into the exposed portion of the thin first gate layer to form a thin first gate material/silicon layer portion then annealing to form the thin third gate layer portion.

36. The method of claim 22, wherein the thin first gate layer is comprised of metal and the conversion of the exposed portion of the thin first gate metal layer to the thin third gate layer portion is accomplished by:
   implanting silicon into the exposed portion of the thin first gate metal layer to form a thin first metal/silicon layer portion then annealing to form the thin third gate layer portion that is comprised of metal silicide.

37. The method of claim 22, wherein the thin first gate layer is comprised of germanium and the conversion of the exposed portion of the thin first gate germanium layer to the thin third gate layer portion is accomplished by:
   implanting silicon into the exposed portion of the thin first gate germanium layer to form a thin first germanium/silicon layer portion then annealing to form the thin third gate layer portion that is comprised of germanium silicide.

* * * * *